US012690632B2

(12) United States Patent
Desmeules

(10) Patent No.: US 12,690,632 B2
(45) Date of Patent: Jul. 28, 2026

(54) ELECTRICAL HEATABLE LINER WITH CONCEALED ACTUABLE CONTROL SWITCH

(71) Applicant: Brooke Erin DeSantis, Montreal (CA)

(72) Inventor: Alain Desmeules, Montreal (CA)

(73) Assignee: Brooke Erin DeSantis, Montreal (CA)

( * ) Notice: Subject to any disclaimer, the term of this patent is extended or adjusted under 35 U.S.C. 154(b) by 923 days.

(21) Appl. No.: 17/834,431

(22) Filed: Jun. 7, 2022

(65) Prior Publication Data

US 2023/0389630 A1 Dec. 7, 2023

(51) Int. Cl.
| | |
|---|---|
| *A41D 13/005* | (2006.01) |
| *A41B 1/08* | (2006.01) |
| *H01H 13/06* | (2006.01) |
| *H05B 1/02* | (2006.01) |
| *H05B 3/34* | (2006.01) |
| *H05K 1/181* | (2026.01) |

(52) U.S. Cl.
CPC ............ *A41D 13/0051* (2013.01); *A41B 1/08* (2013.01); *H01H 13/06* (2013.01); *H05B 1/0272* (2013.01); *H05B 3/342* (2013.01); *H05B 2203/036* (2013.01); *H05K 1/181* (2013.01); *H05K 2201/10053* (2013.01)

(58) Field of Classification Search
CPC ................................................ A41D 13/0051
See application file for complete search history.

(56) References Cited

U.S. PATENT DOCUMENTS

| | | | | |
|---|---|---|---|---|
| 10,201,195 B1 * | 2/2019 | Khaliuta | .................. | H05B 3/34 |
| 2003/0080870 A1 * | 5/2003 | Marmaropoulos | .... | H04B 1/385 |
| | | | | 340/691.1 |
| 2008/0093354 A1 * | 4/2008 | Fang | ...................... | H05B 3/342 |
| | | | | 219/211 |
| 2009/0289046 A1 * | 11/2009 | Richmond | ............ | H01M 50/24 |
| | | | | 429/61 |
| 2011/0185469 A1 * | 8/2011 | Santuccio | ............ | A41D 27/205 |
| | | | | 2/69 |
| 2013/0037531 A1 * | 2/2013 | Gray | .................. | A41D 13/0051 |
| | | | | 219/211 |
| 2015/0230524 A1 * | 8/2015 | Stevens | .................... | H05B 1/02 |
| | | | | 219/494 |
| 2016/0128393 A1 * | 5/2016 | Janda | ................. | A41D 13/0051 |
| | | | | 219/211 |
| 2016/0345655 A1 * | 12/2016 | Beers | ..................... | A41D 1/002 |

(Continued)

*Primary Examiner* — John J Norton
(74) *Attorney, Agent, or Firm* — Guy J. Houle; HOULE PATENT AGENCY INC.

(57) ABSTRACT

An electrically heatable article of apparel, in the form of a vest is equipped with a discrete and concealed control module which is provided with a finger actuating switch positioned for easy access by the fingers of a wearer person. The actuating switch transmits communication signals in the form of time retention presses on the finger actuation switch button to cause the programmed control circuit of the module to perform stored programmed functions. A haptic feedback device generates vibration communication signals to a wearer person's body by the sense of touch. The printed circuit board also acts as a vibration transmitting medium to the finger actuating switch to permit a user person to feel the vibration times of the retention presses through its finger. The control module is concealed in a discrete area of the vest providing easy access to the finger actuating.

19 Claims, 5 Drawing Sheets

(56)                     References Cited

U.S. PATENT DOCUMENTS

| | | | |
|---|---|---|---|
| 2016/0374628 A1* | 12/2016 | Levine ................. | A61B 5/1114 |
| | | | 128/848 |
| 2017/0086513 A1* | 3/2017 | Maxey .................. | H05B 3/347 |
| 2017/0196275 A1* | 7/2017 | Tam ................... | A41D 13/0051 |
| 2018/0295894 A1* | 10/2018 | Yue ......................... | F21V 23/04 |
| 2019/0029877 A1* | 1/2019 | Betkowski .......... | A41D 27/205 |
| 2019/0208836 A1* | 7/2019 | Demers ................. | H05B 3/342 |
| 2021/0178112 A1* | 6/2021 | Ning ...................... | G16H 20/30 |
| 2022/0225696 A1* | 7/2022 | Farrell .................. | H05B 3/345 |

* cited by examiner

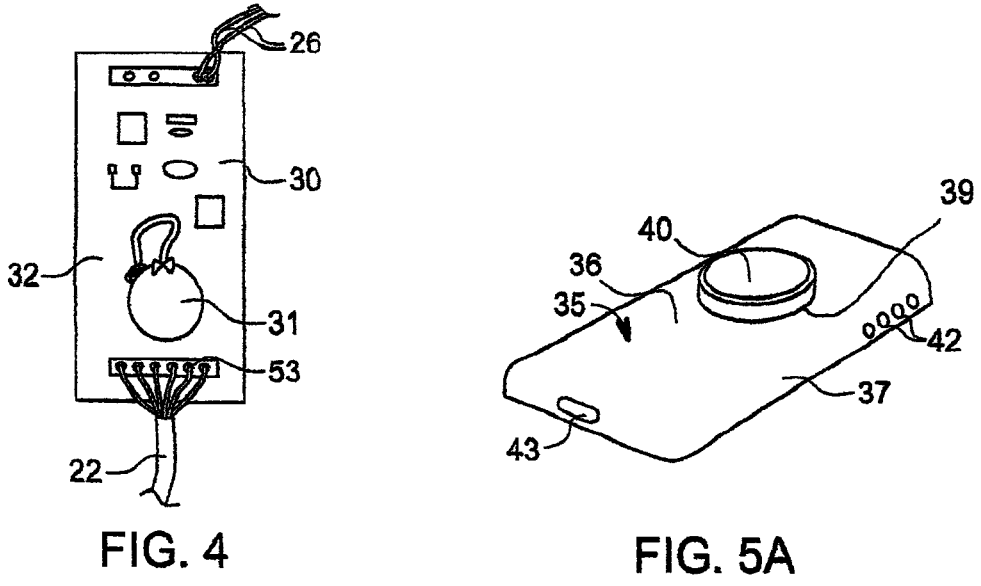
FIG. 4
FIG. 5A
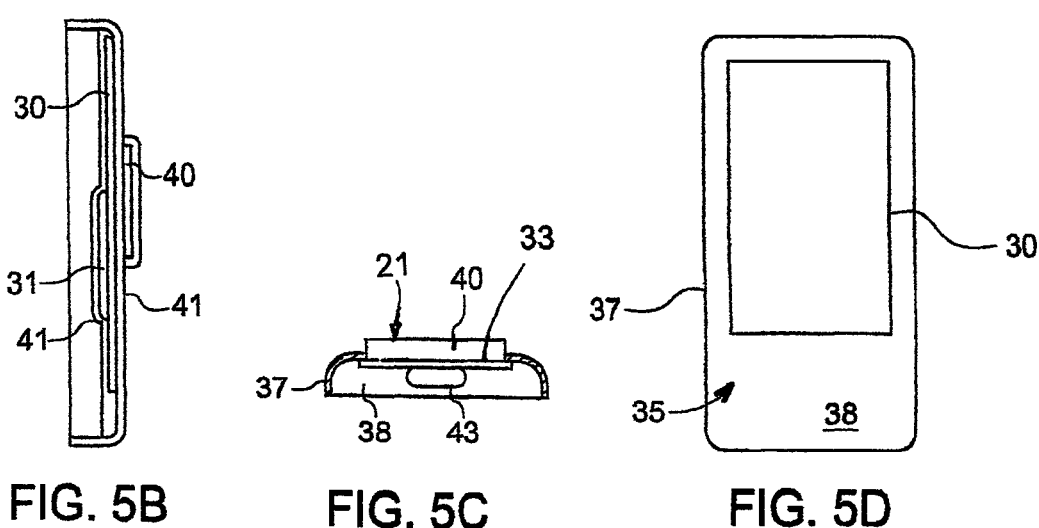
FIG. 5B     FIG. 5C     FIG. 5D

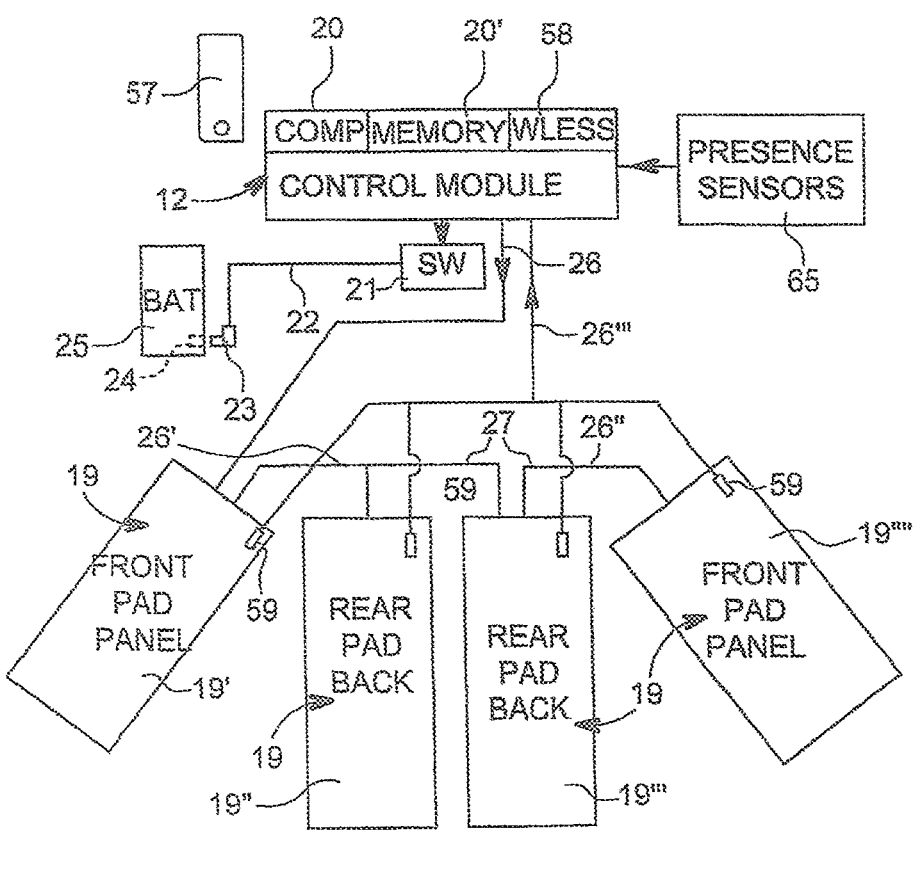
FIG. 8
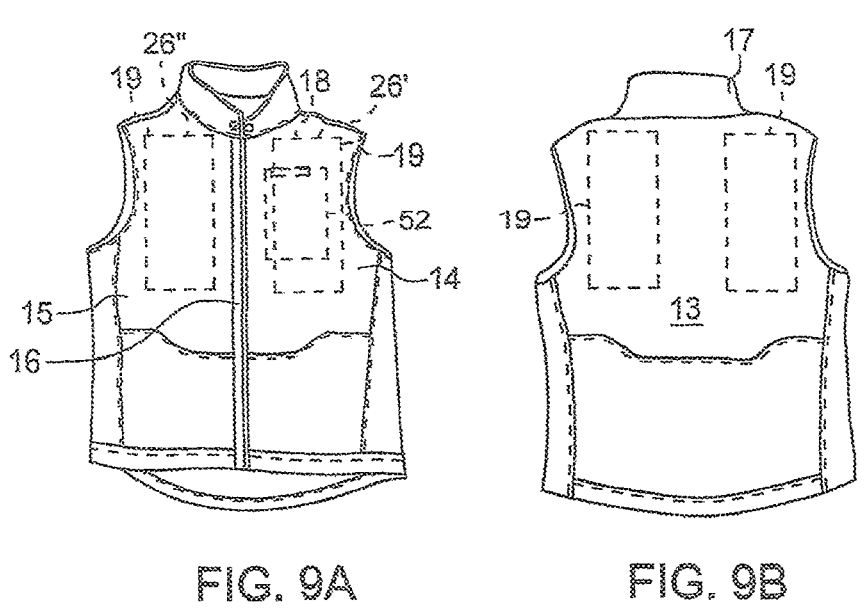
FIG. 9A                              FIG. 9B

ELECTRICAL HEATABLE LINER WITH CONCEALED ACTUABLE CONTROL SWITCH

FIELD OF THE INVENTION

The present invention relates to electrically heated articles of apparel which are controlled by push-button type switches normally mounted on an outer face of the article of apparel at a location for access by the fingers of a wearer person and more particularly the present invention relates to a concealed control switch retained at a known concealed accessible position in article of apparel and capable of providing signal information to a user person which is non-visual nor audible.

This application has a relationship with co-pending U.S. application Ser. No. 17/581,891 filed on Jan. 22, 2022 and entitled Control Device For Mounting On Electrically Heated Articles Of Apparel.

BACKGROUND OF THE INVENTION

Control devices mounted on heated articles of apparel are known in the art whereby to provide a user person an external means to switch the heating wire circuits "on" and "off" and to control the supply of current to the heating wires or heating pads secured in patterns in the article of apparel to thereby control the temperature of the heat generated by the heating wires. These control devices have several wires connected to a circuit board provided with electronic components as well as a switch to control the intensity of the current supplied to the heating wires. Such control devices are also mounted at a convenient location on the outer surface of the article of apparel for visual and easy access to the control switch by the wearer person.

Associated with such control devices is a battery or battery pack to provide power to the heating wires through the control device. These batteries are usually concealed in pouches formed in the article of apparel to provide ease of access when the batteries need to be recharged or replaced by another battery. Many such control devices are usually provided with one or more LED lights which are made visible to the wearer person to indicate that the batteries are charged or of the remaining charge or entirely depleted of their charge and require charging or replacement with charged batteries. LED lights may also be provided to indicate intensity settings, i.e., "low", "medium" or "high" heat intensity. Accordingly, the mounting position of the control device needs to provide visual access to the user person. The electronic control circuits of these devices also require operating voltage from the battery or batteries. When the battery or batteries are permanently connected to the control circuit and need to be charged, the charging voltage is provided through a charging port secured to a supply cable having wires connected to the control circuit through a switch with the charging port made accessible at a convenient location accessible to the user person to permit insertion of a plug-in connector from a supply source to charge the battery or batteries. Tension on the supply cable caused by movements of the user person can also damage the supply cable and its wiring. It is also important to secure these control devices and their batteries at locations which provide protection against bad weather conditions, such as rain or snow.

Still further, as mentioned above, these control devices need to be secured at a visible and accessible location on the outer surface of the article of apparel or supported in a pocket requiring the user person to retrieve the control device and the supply wire connected thereto, for its use. This manipulation is inconvenient to the wearer person and can cause damage to the wiring. Further, the installation of such control devices and its associated wiring and charging cable in an article of apparel requires extra care by the fabricator of such articles with delicate sewing procedures and precise attachment of the long wiring from the control circuits to the heating wires and the battery, to prevent the risk of the wiring becoming detached during use. Such external installations of the control module, requires making openings in the outer shell material of the article of apparel to accommodate wiring and connections to the module and such openings compromises the waterproofing, wind factor and the internal insulation of the article. Still further, these control devices often require that the article of apparel can only be dry cleaned and during such dry-cleaning process damage may be caused to its wiring. Because these known control devices and their associated remote charging port and wiring form a bulky package, their application is somewhat limited to the type of article of apparel that can be equipped with such, and usually limited to installation on jackets, vests, or other convenient upper body garments. Their assembly is often not aesthetically pleasing to the eye.

It would be advantageous to provide a control device capable of overcoming the above mentioned problems of know prior art heated articles of apparel and to provide additional desirable features.

SUMMARY OF THE INVENTION

It is a feature of the present invention to provide an electrically heatable article of apparel wherein the control module is not visible to the eye and located at an easy access location by the fingers of a wearer person to actuate a switch to cause a programed control circuit to execute programmed functions relating to the operation of heating circuits associated with the article of apparel.

Another feature of the present invention is to provide an electrically heatable article of apparel which does not use any visible means, such as LED lights to communicate messages to a wearer person and therefore does not require the control to be mounted externally of the article of apparel and consequently can be secured at very discrete and non-visible locations.

A further feature of the present invention is to provide an electrically heatable article of apparel wherein the communication means to the user person is in the form of vibrations which are sensed on the wearer person's body and simultaneously on the fingers of a user person pressing a switch button and wherein such vibrations are not audible but provide the sense of touch to communicate signal information.

A still further feature of the present invention is to provide an electrically heatable article of apparel which is in the form of a lining secured to an outer wear and wherein the lining may be detachably secured to the outer wear for further use as a heated vest article of apparel.

Another feature of the present invention is to provide an electrically heatable article of apparel which does not require installation on the outer fabric shell of an article of apparel thereby not affecting the characteristics of the outer shell fabric, such as its waterproofing, wind shielding and internal insulation material and further wherein all wiring and heating circuits are concealed within the vest-type article of apparel with minimal wire lengths and in areas of least arm movements.

A further feature of the present invention is to provide a control module which is compact and waterproof and further provided with a push-button switch which when concealed is readily accessible and wherein the module has a haptic feedback device which is located to be positioned over a touch sensitive part of a user persons collar bone region.

A still further feature of the present invention is to provide an electrically heatable article of apparel having at least one heat sensor secured therein and capacitive presence sensors to permit the programed control circuit to monitor temperature signals for adjustments when necessary and to prevent the article of apparel from being put away with the heating wire circuits operative.

Another feature of the present invention is to a control module having a programed control circuits which can be provided with a communication circuit for wireless communication, such as through the internet or other systems permitting wireless operation.

According to the above noted features, from a broad aspect, the present invention provides an electrically heatable article of apparel which is comprised of an upper body enclosing fabric shell defining a rear panel section and opposed frontal side panels. Detachable fasteners connect the opposed frontal side panels together. The upper body enclosing shell defines an open neck area. Electrical heating wire circuits are secured at predetermined locations in the upper body enclosing shell. A control module has a programmed control circuit, a power input connection to receive electrical power from one or more batteries, and an output connection to feed electrical power to the electrical heating wire circuits. A finger actuating switch is mounted on a support in the control module to transmit communication signals, in the form of time retention switch presses on said finger actuation switch, to cause the programmed control circuit to perform stored programmed functions. An haptic feedback device is also mounted on the support to generate vibration communication signals to a wearer person's body by the sense of touch. The support acts as a vibration transmitting medium to the finger actuating switch to permit a user person to feel the vibration communication signals through a finger disposed on the switch. The control module is mounted in an accessible concealed area of the body enclosing shell to provide easy access to the finger actuating switch by the fingers of the wearer person and is not visible to the eye.

BRIEF DESCRIPTION OF THE DRAWING

A preferred embodiment of the present invention will now be described with reference to the accompanying drawings in which:

FIG. 4 is a plan view of a printed circuit board of the control module on which various components of the module are mounted and connections made thereto;

FIG. 5A is a perspective view of the control module housing as seen from the front with a push-button switch projecting above the outer surface thereof;

FIG. 5B is a cross-sectional side view of the housing illustrating the position of the printed circuit board with a haptic feedback device projecting rearwardly of the printed circuit board;

FIG. 5C is a transverse cross-sectional view further illustrating the position of the printed circuit board and the haptic feedback device in relation to the push-button switch;

FIG. 5D is a rear view of the control module housing illustrating the size relationship of the circuit board with respect to the housing;

FIG. 8 is a block diagram illustrating the electrical connection topography of the control module of the present invention with its various components and associated devices;

FIG. 9A if a front view of the heated vest showing the location of the frontal batteries and the position of the interconnecting wiring leading to the front and back heating pads and as well as illustrating the accessible position of the battery pouch relative to the control device location;

FIG. 9B is a rear view of FIG. 10A showing the location of the rear panel batteries;

DESCRIPTION OF THE PREFERRED
EMBODIMENT

Before any embodiments of the application are explained in detail, it is to be understood that the application is not limited to the details of construction and the arrangement of component part set forth in the following description or illustrated by the following drawings. Further, it is to be understood that the phraseology and terminology used herein is for the purpose of description and should not be regarded as limiting but should encompass equivalents thereof.

Figures 1, 2, 3:
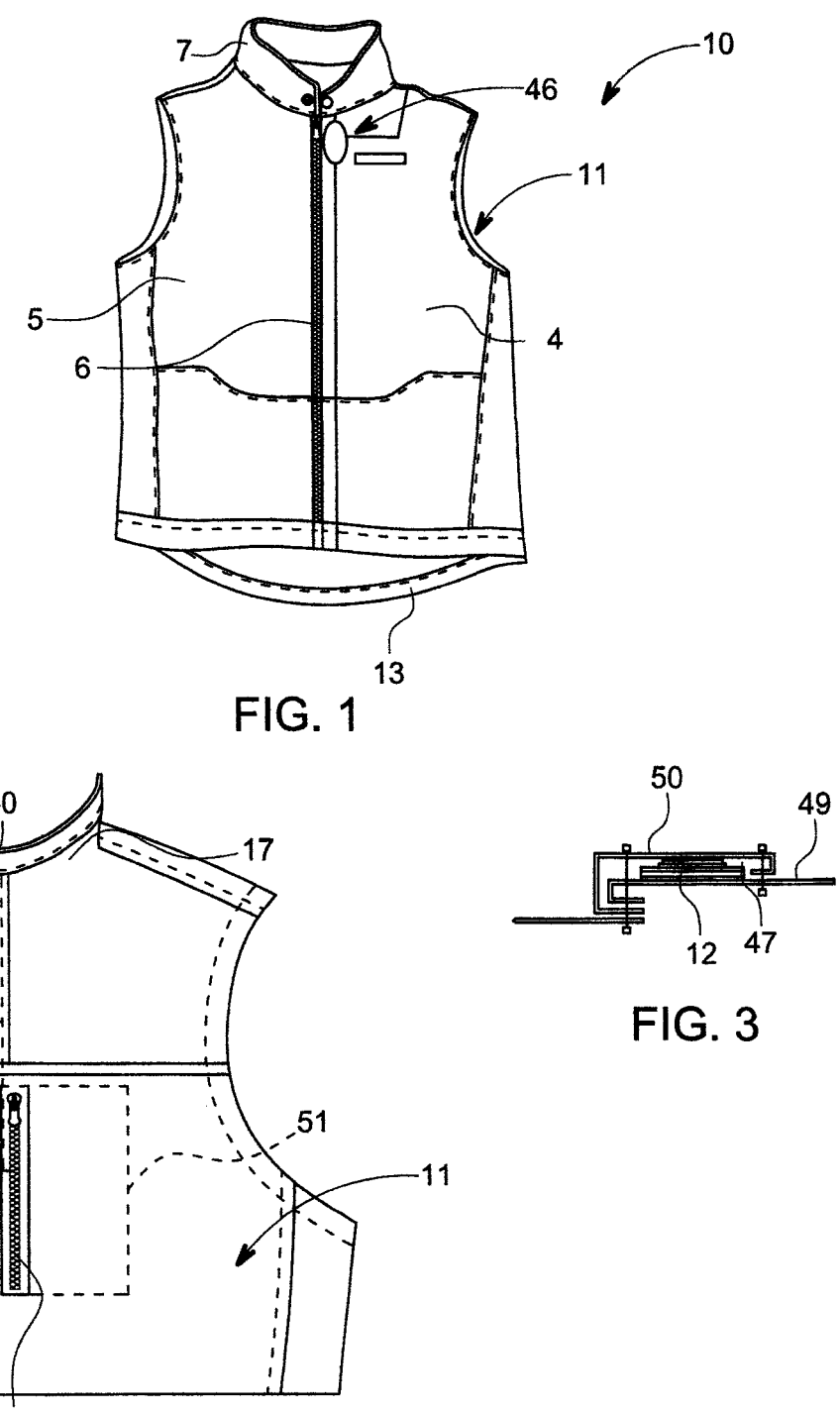
FIG. 1 is a front view of a vest-type article of apparel is which has been incorporated the control module of the present invention and which is not visible to the eye and capable of forwarding information signals to a programmed control circuit to effect a heating function as well as transmitting information to a user person.
FIG. 2 is a fragmented front view of an upper portion of one of the frontal side panels of the vest illustrating the position of the pocket in which the control module of the present invention is retained.
FIG. 3 is a cross-section view along cross-section lines A-A of FIG. 2 illustrating the construction of the control module pocket.

Referring now to the drawings, and more particularly to FIG. 1 to 3, there is shown generally at 10 an article of apparel in the form of a vest 11 having incorporated therein the discrete and concealed control module 12 of the present invention. It is pointed out that the control module 12 may be mounted in other articles of apparel equipped with electric heating circuits, provided it is worn directly over the body of the wearer person. As herein illustrated, and with further reference to FIGS. 9A and 9B, the vest 11 is an upper body enclosing fabric shell which defines a rear panel section 3 and opposed frontal side panels 4 and 5. The frontal panels 4 and 5 are secured together by detachable fastening means, herein a zipper 6, to connect the opposed frontal side panels together with the zipper extending in an upper collar section 7 above the frontal panels and into the neck area. Electric heating pads 19 are mounted in the back panel 3 and the frontal panels to give heat to a wearer person. Such electrically heated articles of apparel are well known in the art and usually include a control mounted in the upper part of the frontal panel to permit a wearer person to switch "on" and "off" the heating feature and to make adjustments to its intensity by the display of small LED lights provided on the control. The present invention is concerned with this visual aspect of such controls and proposes a new control assembly which is discrete and concealed, easily accessible and operable, and wherein the signal information is no longer visible to the eye.

Referring to FIG. 8, it is a block diagram illustration of the control module and its association with different component parts of its system. As shown, the control module 12 has a programmed computer 20 provided with a memory 20' in which is stored specific functions to be performed by the control module. The control module has a switch 21 which is made accessible to a user person and to which is connected a power input cable 22 fitted at an end with a plug-in connector 23 adapted to engage in a connecting port 24 of a battery 25 supported by the article of apparel at a convenient location to receive electrical power from one or more of such battery 25. An output connection cable 26 provides power to the heating pads 19 which are interconnected in a continuous wiring circuit 27. As herein shown, and with additional reference to FIGS. 9A and 9B, the cable 26 connects the pads 19 in parallel and the cable connects to a first of the pads 19', over the shoulder of the vest by cable section 26' to pads 19" and 19'" and by cable section 26" over the opposite shoulder and back to the control module by the return wire 26'". The switch 21 is a finger actuating push-button switch mounted on a support, as will be described later, in the control module. By finger pressing the switch push-button, in the form of time retention presses, stored programmed functions are executed by the programmed control circuit. It is pointed out, that the heating pads 19 illustrated herein may take different shapes, sizes and dispositions or be replaced by heating wire patterns sewn into pattern forms on an inner fabric lining. Accordingly, the present invention is not to be construed as limiting to the illustrated heating pads as shown in the drawings.

Referring to FIGS. 4 to 5D the construction of the control module 12 will now be described. The control module component parts are mounted on a printed circuit board 30 which is a rigid board. A haptic feedback device 31, in the form of a large disc with a flat outer face, is mounted on the rear face 32 of the printed circuit board 30 and generates vibration communication signals commensurate with the time retention presses exerted on the push-button switch 21 which is mounted on the front face 33, see FIG. 5C, of the printed circuit board 30. As will be described later the haptic feedback device 31 is shown secured to the article of apparel at a location, herein the collar bone region, where the vibrations generated thereby will be transmitted against a more sensitive region of the skin of the wearer person. Simultaneously, has the push-button switch is depressed by a finger of the user person the same vibrations generated by the haptic feedback device will be sensed on the finger giving the user person a signal representative of the time lapse of the press. This provides assurance to the user person of its proper execution of a desired signal, i.e., short or long retention press(es). It is pointed out that the printed circuit board support acts as a vibration transmitting medium between the haptic feedback device and the finger actuating switch which permits the user person to feel the vibration time retention presses through its finger. In the event that the vest is not closed over the collar bone region area of the wearer person, the location of the control device concealed immediately adjacent the zipper can be grasped between the fingers of the wearer person and squeezed therebetween. Haptic vibrations are then transmitted to both fingers of the user person, herein the thumb and the index finger.

Referring to FIGS. 5A to 5D, there is illustrated one form of the construction of the control module and as herein shown, it is mounted in a protective plastics housing 35 defining a front wall 36, a peripheral contour flange wall 37, depending about said front wall, and a rear open end 38. A button opening 39 is formed in the front wall 36 for the passage of the push-button 40 of the push-button switch 21. As shown, the printed circuit board 30 is mounted in the rear opening with the push-button 40 extending through the button opening 39 and extending above the front wall 36. The contour wall 37 projects above the printed circuit board and a water-proofing soft silicon material film 41 is bonded over the printed circuit board and the push-button to waterproof the entire housing and components. The soft silicon coating does not hinder the movement of the finger actuating push-button to be time retention pressed and permits it to bounce back to execute desired time retention communication signals. Holes 42 are provided in the side wall of the contour wall 37 for the passage of the output wiring to the heating pads 19. The hole 43 in the end wall of the contour wall is for the passage of the power cable 22.

Figure 7:
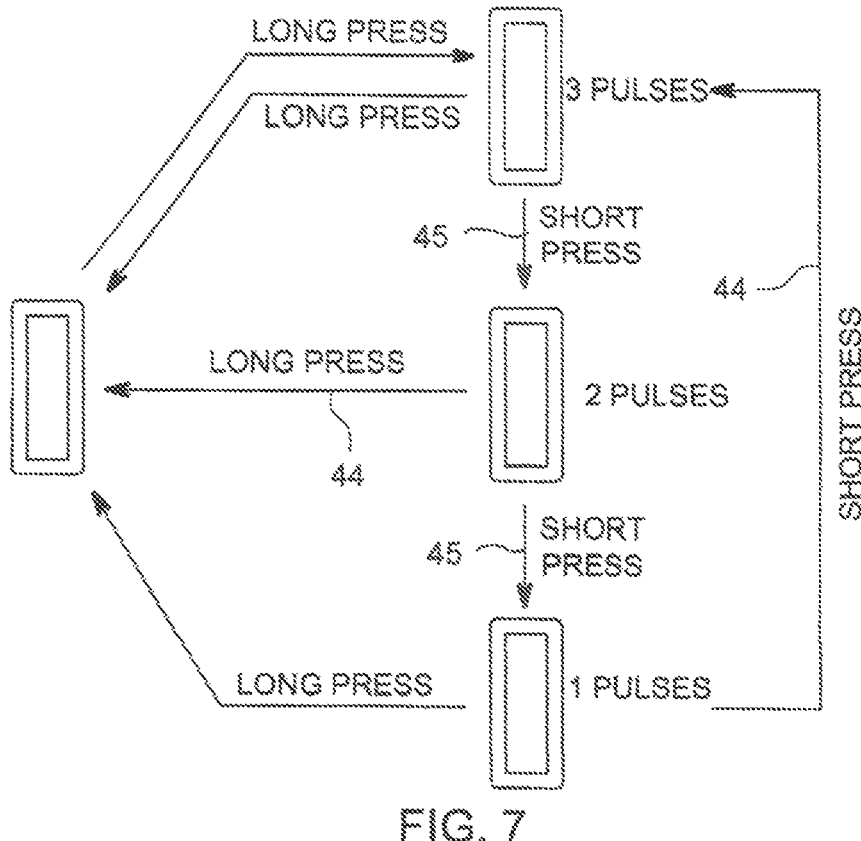
FIG. 7 is a schematic view illustrating the different types of time retention presses to command different functions as illustrated and executed by the programmed control circuit of the control module.

With reference to FIG. 7, it is pointed out that the finger actuating push-button switch 40 is depressed to provide two different types of time delay signals to the programed controller circuit 20. These time delay switch depressions comprise a long retention switch press and a short retention switch press, as denoted by arrows 44 and 45. The long retention switch presses cause the programmed controller circuit 20 to connect or disconnect power from the power input cable 22 from the battery 25. The short retention switch press provides for the user person to cycle through different heat intensity settings of the electrical heating pads 19. As herein illustrated, there are three different heat intensity settings, each corresponding to a respective one of one, two or three short switch button presses. As mentioned herein above, each of the presses triggers the haptic feedback device to generate vibration (a buzzing vibration) which is felt on the wearer person's body and simultaneously on the switch button actuating finger of the user person reassuring the user person that the proper signal was initiated.

Figure 6:
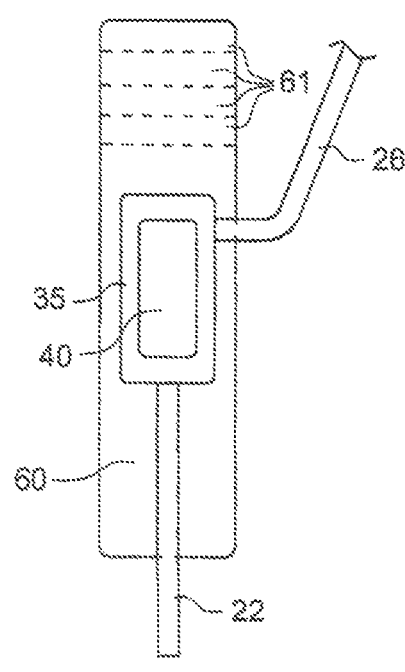
FIG. 6 is a plan view of a support patch on which the control module may be secured and its adaptation for attachment to articles of apparel of different sizes as well as illustrating the position of the power input cable and the power output leads.

Referring back to FIGS. 1 to 3, there is illustrated a preferred location for mounting the control module of the present invention. As herein illustrated, the control device is mounted in a frontal upper area 46 over the collar bone area of a wearer person and which collar bone area is highly sensitive to the detection of touch, herein vibration communication signals generated by the haptic feedback device. A control module fabric enclosure 47 is constructed in this area adjacent the zipper 6 and formed on the outer lining fabric 49 of a double-lined the vest 11. The location provides ease of access by the fingers of the wearer person for actuation of the finger actuating switch button 40. As shown in FIG. 6, the control housing may also be secured to a support fabric patch 60 having delineated thereon removable sections 61 to adapt its mounting to articles of apparel of different sizes, i.e. small, medium, large, extra large, by simply cutting-off some of the sections 61 during fabrication. The entire fabric patch is also overmolded with soft silicone material. The enclosure or pouch 47 is formed by stitching a fabric overlay material piece 50 to the outer lining material 49 to hold the control module captive therein, as shown in FIG. 3. On the other hand, the enclosure 47 may have a top open end with a closure, i.e. a hook and loop closure, to provide access to the control module. As illustrated, the battery storage pocket 51 is formed in the frontal side panel 4 in close proximity to the control module enclosure 47 to reduce wire length. in which the battery is stored.

Figures 10A, 10B:
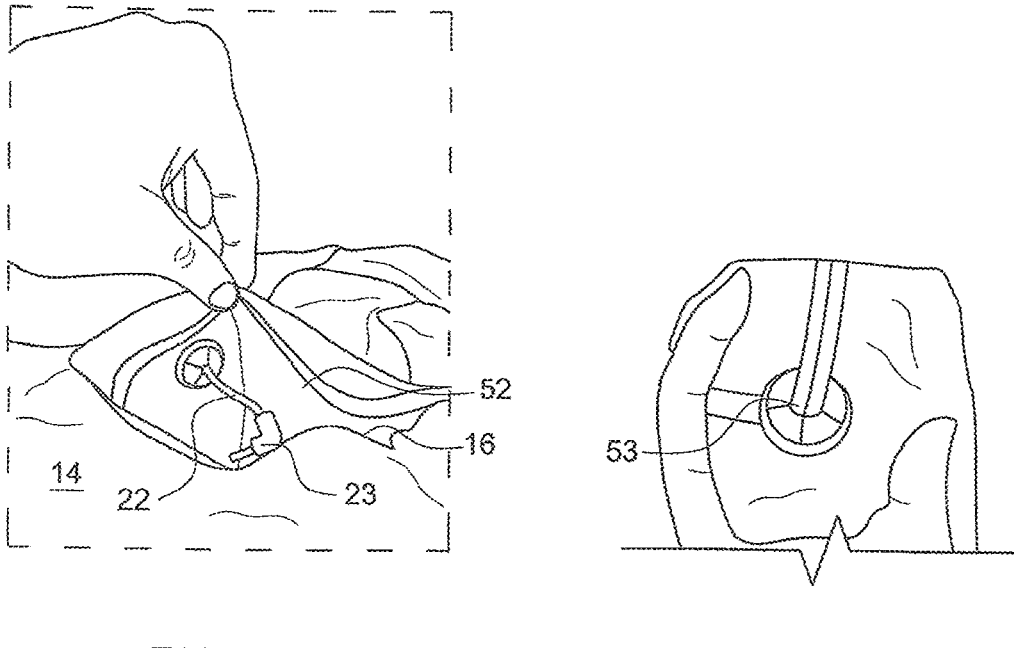
FIG. 10A is a fragmented perspective view showing the battery pouch being opened and the location of the concealed power connector cable for removable connection to the battery.
FIG. 10B is a close-up view showing the construction of the power lead output port secured in the inner pouch lining for the passage of the power connector cable.

As shown in FIGS. 10A and 108, the battery storage pocket has a side zipper opening 52 for the insertion and access of the battery connector 23 secured at the end of the supply cable 22 which is connected at an opposed end to the power input terminals 53 on the printed circuit board 30 of the control module. As can be seen, the supply cable 22 is concealed between the two layers of lining material and is of a short length because the pocket is mounted close to the control module. A wire and fabric protective patch 53 is secured to the battery storage pocket inner lining material and through which an opening is formed which communicated with the control module enclosure 47.

Referring back to FIG. 8, there is illustrated heat sensors 59 secured to the fabric pads 19 to provide feedback signals to the programmed control circuit 20 which are representative of the actual heat temperature generated by the electrical heating wire circuits in the fabric pads 19. This permits the programmed control circuit to automatically reduce or increase the intensity of the current to the heating wires in the pads in relation the heat setting selected by the user person for the comfort of the wearer person. As also illustrated, the control module may be provided with a wireless communication circuit 58 to permit remote control of some of its functions remotely by a wireless telephone device 57 through the internet or by wireless communication. The vest 11 may also be equipped with capacitive sensors 65 mounted therein at one or more predetermined locations to detect the continuous presence of a wearer person's body. These capacitive sensors would feed signal information to the programmed control circuit 12 which would be programmed with a power disconnect function to effect a power disconnect through the switch 21 when the signal information indicates that the wearer person's body is no longer present and that the power has been accidently maintained connected to the heating pads 19.

Figure 11:
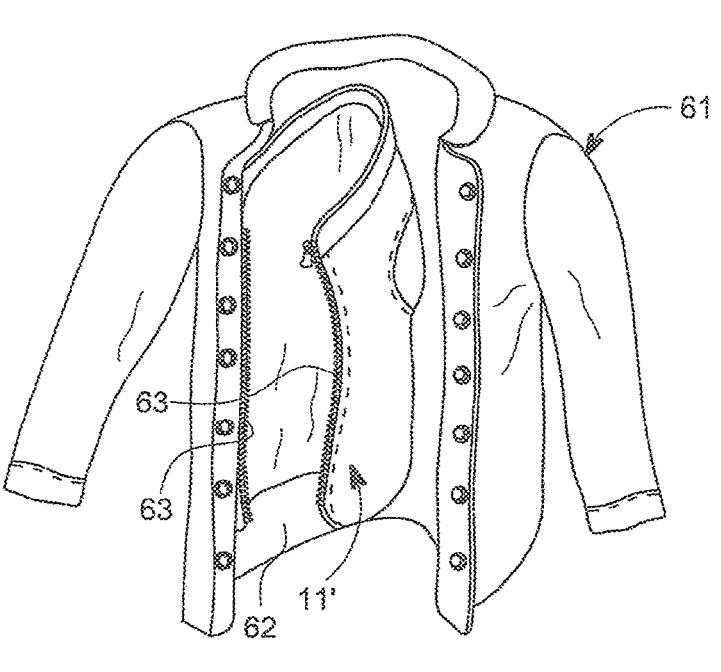
FIG. 11 is a perspective view of an outerwear article of apparel fitted with an inner lining in the form of a vest constructed in accordance with the present invention and wherein the vest may be detachably secured to the inner surface of the outerwear to be worn as a stand-alone article of apparel or as an inner liner for an outerwear.

FIG. 11 illustrates an application of the vest 11', herein utilized as a liner adapted to be worn on a wearer person's body and under an outer article of apparel 61, to provide warmth to the wearer person's body during cold weather conditions. The liner 11', is herein shown as being removably secured to the inner surface 62 of an outer article of apparel 61 by detachable fasteners, herein zippers 63, or by other closures, such as, hook and loop fasteners, magnetic fasteners, and loop and button fasteners.

Many modifications and other embodiments of the present invention as described above will come to mind to a person skilled in the art to which the invention pertains having the benefit of the teachings described herein above and the drawings. Hence, it is to be understood that the embodiments of the present invention are not to be limited to the specific examples thereof as described herein and other embodiments are intended to be included within the scope of the present invention and the appended claims. Although the foregoing descriptions and associated drawings describe example embodiments in the context of certain examples of the elements and members and/or functions, it should be understood that different combinations of elements or substitutes and/or functions may be provided by different embodiments without departing from the scope of the present invention as defined by the appended claims. Furthermore, although specific terms are employed herein, they are used in a generic and descriptive sense only and other equivalent terms are contemplated herein with respect to the items that they relate to. It is therefore within the ambit of the resent invention to encompass all obvious modifications of the examples of the preferred embodiment described herein provide such modifications fall within the scope of the appended claims.

The invention claimed is:

1. An electrically heatable article of apparel comprising:
an upper body enclosing fabric shell defining an open neck area;
said shell having a rear panel section and opposed frontal side panels;
detachable fastening means to connect said opposed frontal side panels together;
electrical heating wire circuits secured at predetermined locations in said upper body enclosing shell;
a control module having a programmed control circuit, said control module having a power input connection to receive electrical power from one or more batteries and an output connection to feed electrical power to said electrical heating wire circuits;
a finger actuating switch mounted on an outer side of a support in said control module to transmit communication signals in the form of time retention switch presses on said finger actuation switch to cause said programmed control circuit to perform stored programmed functions;
a haptic feedback device in the form of a disc is mounted on an inner side of said support to and generates vibration communication signals to the skin of a wearer person's body by the sense of touch, said support acting as a vibration transmitting medium to said finger actuating switch to permit a user person to simultaneously feel said vibration communicating signals generated by said time retention presses through a finger of said user person;
said control module being mounted in an accessible concealed area of said body enclosing shell and being invisible to the eye while providing easy access to said finger actuating switch by the fingers of a wearer person, and wherein said haptic feedback device is in close relationship with said wearer person's body to permit said vibration communicating signals to be sensed on said skin of said wearer person's body.

2. The electrically heatable article of apparel as claimed in claim 1 wherein said control module is mounted in a frontal upper area of one of said opposed frontal side panels.

3. The electrically heatable article of apparel as claimed in claim 2 wherein said frontal upper area is adjacent to the collar bone area of said wearer person and which collar bone area is highly sensitive to the detection of said vibration communication signals generated by said haptic feedback device.

4. The electrically heatable article of apparel as claimed in claim 3 wherein said control module is mounted in a fabric control module enclosure formed adjacent an upper edge in one of said opposed frontal side panels adjacent said fastening means to provide ease of access by the fingers of said wearer person for actuation of said finger actuating switch.

5. The electrically heatable article of apparel as claimed in claim 4 wherein said fabric control module enclosure is formed between an outer face of said upper edge and a fabric overlay with said finger actuating switch facing said fabric overlay, said fabric overlay providing ease of detection and retention of said finger actuating switch by the fingers of said wearer person.

6. The electrically heatable article of apparel as claimed in claim 2 wherein said heatable article of apparel is a lining type article of apparel, said lining being comprised of two layers of lining material secured to one another, said electrical heating wire circuits being in the form of heating panels immovably secured between said two layers of lining material and disposed in said rear panel section and said opposed frontal side panels.

7. The electrically heatable article of apparel as claimed in claim 6 wherein one of said opposed frontal side panels is provided with a battery storage pocket, an opening in said battery storage pocket for the passage and access of a battery connector secured at an end of a supply cable which is connected at an opposed end to said power input connection of said control module, said supply cable being concealed between said two layers of lining material.

8. The electrically heatable article of apparel as claimed in claim 7, wherein said battery storage pocket is located in an upper area of said one of said opposed front side panels.

9. The electrically heatable article of apparel as claimed in claim 1 wherein said support is a printed circuit board on which said programmed control circuit is mounted, said finger actuating switch being a push-button switch mounted on said printed circuit board.

10. The electrically heatable article of apparel as claimed in claim 9 wherein said control module is comprised of a protective housing having a front wall, a peripheral contour flange depending about said front wall, and a rear open end; a button opening in said front wall, said printed circuit board being mounted in said rear open end with said push-button switch extending through said button opening and extending above said front wall, said peripheral contour flange projecting above said printed circuit board, and a water-proofing soft silicone material bonded over said printed circuit board and said push-button switch and permitting said push-button switch to be time retention pressed to execute desired ones of said communication signals.

11. The electrically heatable article of apparel as claimed in claim 10 wherein said finger actuating push-button switch is depressed to provide two different types of said time delay signals to said programmed controller circuit, said two different types of time delay signals being comprised of a long retention switch press and a short retention switch press, said long retention switch press causing said programmed controller circuit to connect or disconnect power from said power input connection from said one or more batteries; said short retention switch press providing for a user person to cycle through two or more different heat intensity settings of said electrical heating wire circuits and to select ones of said heat intensity settings.

12. The electrically heatable article of apparel as claimed in claim 1 wherein said electrical heating wire circuits are secured in fabric pads, and one or more heat sensors are secured to said fabric pads and provide feedback signals to said programmed control circuit representative of the actual heat generated by said electrical heating wire circuits in said fabric pads.

13. The electrically heatable article of apparel as claimed in claim 1 wherein said heatable article of apparel is a liner in the form of a vest adapted to be worn on a wearer person's body and under an outer article of apparel to provide warmth to said wearer person's body during cold weather conditions.

14. The electrically heatable article of apparel as claimed in claim 1 wherein said heatable article of apparel is a liner removably secured to an inner surface of an outer article of apparel by detachable fastening means.

15. The electrically heatable article of apparel as claimed in claim 14 wherein said liner, when detached from said outer article of apparel, permits said outer article of apparel to be cleaned or washed without said liner, which is a non-washable liner.

16. The electrically heatable article of apparel as claimed in claim 1 wherein said programmed control circuit has a computer provided with a memory which is programmed to cause said haptic feedback device to generate said vibration communication signals, said programed control circuit having a wireless communication circuit to further permit wireless control of said haptic feedback device by smart wireless remote devices.

17. The electrically heatable article of apparel as claimed in claim 1 wherein said upper body fabric enclosing shell is provided with one or more capacitive sensors mounted therein at one or more predetermined locations to detect the presence of a wearer person's body, said capacitive sensors providing signal information to said programmed control circuit which is programmed with a power disconnect function to effect a power disconnect when the signal information indicates that the wearer person's body is no longer present and that the power has been accidently maintained connected to said heating wire circuits.

18. An electrically heatable article of apparel comprising:
  an upper body enclosing fabric shell, said shell having a rear panel section and opposed frontal side panels;
  detachable fastening means to connect said opposed frontal side panels together;
  said upper body enclosing shell defining an open neck area;
  electrical heating wire circuits secured at predetermined locations in said upper body enclosing shell;
  a control module having a programmed control circuit mounted in a frontal upper area of one of said opposed frontal side panels adjacent to the collar bone area of a wearer person and which collar bone area is highly sensitive to the detection of vibration communication signals;
  said control module being mounted in a fabric control module enclosure formed adjacent an upper edge in one of said opposed frontal side panels adjacent said fastening means to provide ease of access by the fingers of said wearer person for actuation of a finger actuating switch;
  said fabric control module enclosure being formed between an outer face of said upper edge and a fabric overlay with said finger actuating switch facing said fabric overlay;
  said fabric overlay providing ease of detection and retention of said finger actuating switch by the fingers of said wearer person;
  said control module having a power input connection to receive electrical power from one or more batteries and an output connection to feed electrical power to said electrical heating wire circuits;

said finger actuating switch being mounted on a support in said control module to transmit communication signals in the form of time retention switch presses on said finger actuation switch to cause said programmed control circuit to perform stored programmed functions;

a haptic feedback device in the form of a disc is also mounted on said support and generates vibration communication signals to a wearer person's body by the sense of touch;

said support acting as a vibration transmitting medium to said finger actuating switch to permit a user person to feel said time retention presses through a finger, and wherein said control module is mounted in an accessible concealed area of said body enclosing shell providing easy access to said finger actuating switch by the fingers of a wearer person and being invisible to the eye.

19. An electrically heatable article of apparel comprising:

an upper body enclosing fabric shell;

said shell having a rear panel section and opposed frontal side panels;

detachable fastening means to connect said opposed frontal side panels together;

said upper body enclosing shell defining an open neck area;

electrical heating wire circuits secured at predetermined locations in said upper body enclosing shell;

a control module having a programmed control circuit;

said control module having a power input connection to receive electrical power from one or more batteries and an output connection to feed electrical power to said electrical heating wire circuits;

a finger actuating switch mounted on a printed circuit board on which said programmed control circuit is mounted, said finger actuating switch being a push-button switch mounted on an outer face of said printed circuit board and projecting there above;

a haptic feedback device is mounted on an inner face of said printed circuit board facing a wearer person's body;

said finger actuation switch transmitting communication signals to cause said programmed control circuit to perform stored programmed functions;

said haptic feedback device being a disc mounted on said printed circuit board and which generates vibration communication signals to a wearer person's body by the sense of touch;

said printed circuit board acting as a vibration transmitting medium to said finger actuating switch to permit a user person to feel said vibration communication signals through a finger;

said control module being comprised of a protective housing having a front wall with a peripheral contour flange depending about said front wall, and a rear open end;

a button opening in said front wall;

said printed circuit board being mounted in said rear open end with said push-button switch extending through said button opening and extending above said front wall;

said peripheral contour flange projecting above said printed circuit board;

a water-proofing soft silicone material bonded over said printed circuit board and said actuating push-button switch while permitting said finger actuating push-button to be pressed to execute desired ones of said communication signals, and wherein said control module being mounted in an accessible concealed area of said body enclosing shell providing easy access to said finger actuating switch by the fingers of a wearer person while remaining concealed.

\* \* \* \* \*